United States Patent [19]
Geller et al.

[11] Patent Number: 5,522,933
[45] Date of Patent: Jun. 4, 1996

[54] PARTICLE-FREE MICROCHIP PROCESSING

[76] Inventors: Anthony S. Geller, 7723 Storrie Pl. NE.; Daniel J. Rader, 7217 Ottawa Rd. NE., both of Albuquerque, N.M. 87109

[21] Appl. No.: 246,049

[22] Filed: May 19, 1994

[51] Int. Cl.⁶ .................................................. C23C 16/00
[52] U.S. Cl. .................. 118/723 E; 118/723 R; 118/725
[58] Field of Search ............ 118/723 R, 723 E, 118/725

[56] References Cited

U.S. PATENT DOCUMENTS

| 3,603,284 | 9/1971 | Garnache | 118/725 |
| 4,962,727 | 10/1990 | Harada | 118/725 |

FOREIGN PATENT DOCUMENTS

90/10092  9/1990  WIPO .

OTHER PUBLICATIONS

Compton, Chief Editor, "PECVD: A Versatile Technology," *Semiconductor International*, pp. 60–65, Jul. 1992.
Klavs, Jensen F., Einset, Erik O. and Fotiadis, Dimitrios I., "Flow Phenomena In Chemical Vapor Deposition of Thin Films," *Annu. Rev. Fluid Mech.*, vol. 23, pp. 197–232, 1991.

*Primary Examiner*—Richard Bueker
*Attorney, Agent, or Firm*—George H. Libman

[57] ABSTRACT

Method and apparatus for reducing particulate contamination in microchip processing are disclosed. The method and apparatus comprise means to reduce particle velocity toward the wafer before the particles can be deposited on the wafer surface. A reactor using electric fields to reduce particle velocity and prevent particulate contamination is disclosed. A reactor using a porous showerhead to reduce particle velocities and prevent particulate contamination is disclosed.

6 Claims, 2 Drawing Sheets

PARTICLE-FREE MICROCHIP PROCESSING

The United States Government has rights in this invention pursuant to Contract Number DE-AC04-76DP00789 between the Department of Energy and the American Telephone and Telegraph Company.

BACKGROUND OF THE INVENTION

Microchip wafers can be processed by flowing processing gases over the surface of a wafer. Many gas flow processing steps are required to accomplish the required etches and depositions, and uniform processing conditions must be maintained over the wafer surface for the processing to yield functional microchips. The processing equipment also must be carefully designed to limit the number of impurities that are introduced. High yields of good microchips are only achievable with careful process control and minimal impurities.

Chemical vapor deposition (CVD) is one example of such a gas flow process. A susceptor holds the wafer in a processing chamber. The processing gases are directed evenly over the surface of the wafer by forcing the gases to flow through one or more perforated plates, commonly called showerheads and typically oriented parallel to the wafer. Due to the flow restriction offered by the showerhead, the gas accelerates while passing through the showerhead and flows evenly over the wafer surface. The processing gases are continually exhausted from the chamber after they pass the wafer.

A primary factor reducing the yield of good microchips from such a reactor is the unintended deposition of particles. Processing gases can contain small numbers of particle contaminants. Particle contaminants can also be generated from the various parts of the reactor and suspended in the gas. As the gas accelerates while passing through the showerhead, the entrained particles are also accelerated. Particles can be accelerated through conventional showerheads to high enough velocities to be inertially deposited on the wafer. Even if this acceleration is insufficient to cause inertial deposition, particles can still be deposited on the wafer by forces such as gravity and thermophoretic effects. There is a need for improvements to the design of processing chambers to reduce the contamination by particles and therefore increase the yield of good microchips.

SUMMARY OF THE INVENTION

An object of the present invention is to reduce particle contamination in microchip processing.

Another object of the invention is to reduce particle acceleration in the showerhead.

Another object of the invention is to decelerate particles so that reduced numbers are inertially deposited on the wafer.

Another object of the invention is to use electrostatic force to reduce particle deposition by balancing other forces acting on contaminant particles, such as gravity.

Additional objects, advantages, and novel features will become apparent to those skilled in the art upon examination of the following description or may be learned by practice of the invention. The objects and advantages of the invention may be realized and attained by means of the instrumentalities and combinations particularly pointed out in the appended claims.

One embodiment of the invention uses a porous showerhead. The many tortuous paths through the porous showerhead serve to evenly distribute the processing gas flow. The tortuous paths can also reduce particle contamination by reducing the number of particles having high velocities toward the wafer.

In another embodiment of the invention an electric field is used to repel charged particles from the surface of the wafer. The electric field is generated between a showerhead and the wafer surface. The processing gas flows freely and evenly in the presence of the electric field while contaminant particles are electrostatically inhibited from being deposited on the wafer surface.

Another embodiment of the invention uses two electric fields to reduce particulate contamination. The processing gas flows through a first electric field that can prevent particles of one charge from proceeding toward the wafer. The processing gas then flows through a second electric field that can prevent oppositely charged particles from being deposited on the wafer surface.

DESCRIPTION OF THE FIGURES

The accompanying drawings, which are incorporated into and form part of the specification, illustrate an embodiment of the invention and, together with the description, serve to explain the principles of the invention.

DETAILED DESCRIPTION OF THE INVENTION

Figure 1:
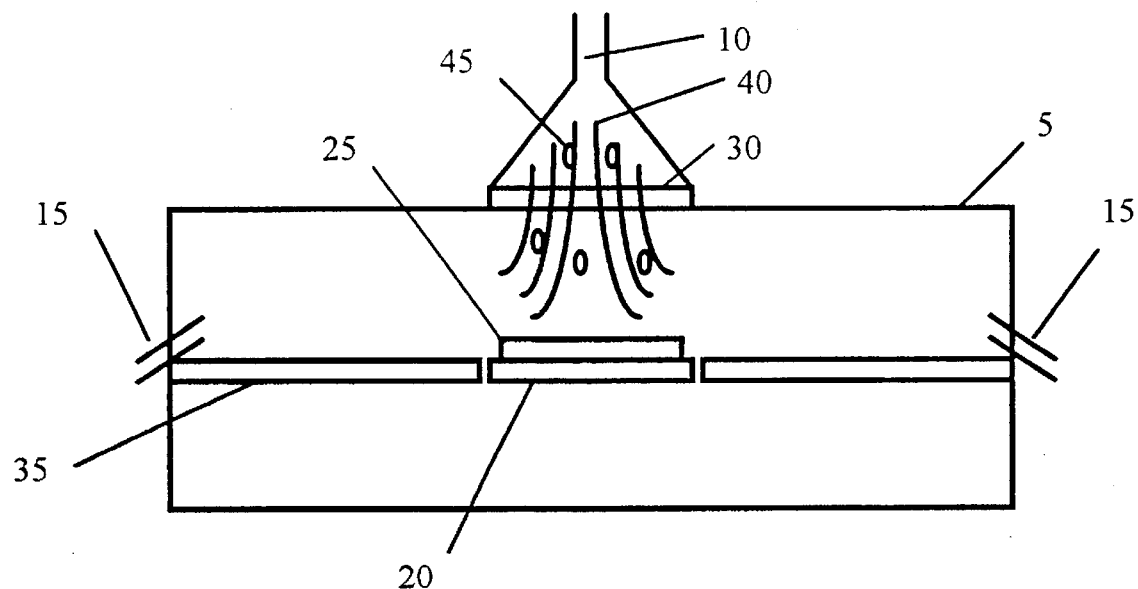
FIG. 1 is a cross-sectional view of a prior art CVD reactor.

FIG. 1 shows a cross sectional view of a prior art CVD reactor. Processing gas can be introduced to the processing chamber 5 from an external source connected at gas inlet 10. Gas can be exhausted from the chamber 5 via exhaust ports 15. The wafer 25 being processed is held on a susceptor 20. The gas is directed evenly onto the surface of the wafer by a perforated first showerhead 30. Internal baffles 35 in the chamber 5 can help direct the gas evenly across the wafer 25 and to the exhaust ports 15. The gas flow above the wafer 25 is represented in the figure by streamlines 40. Contaminant particles 45 in the gas flow can be deposited on the wafer 25 by their inertia or by other forces such as gravity.

The wafer is typically 8 inches in diameter. The showerhead is typically 8 inches in diameter, and 0.1 inch to 1.0 inch thick. The processing chamber can be approximately 14 inches across. The processing gases can be introduced to the chamber at rates from 50 SCCM to 4000 SCCM. Operating pressures can range from 10 mTorr to one atmosphere.

Figure 2:
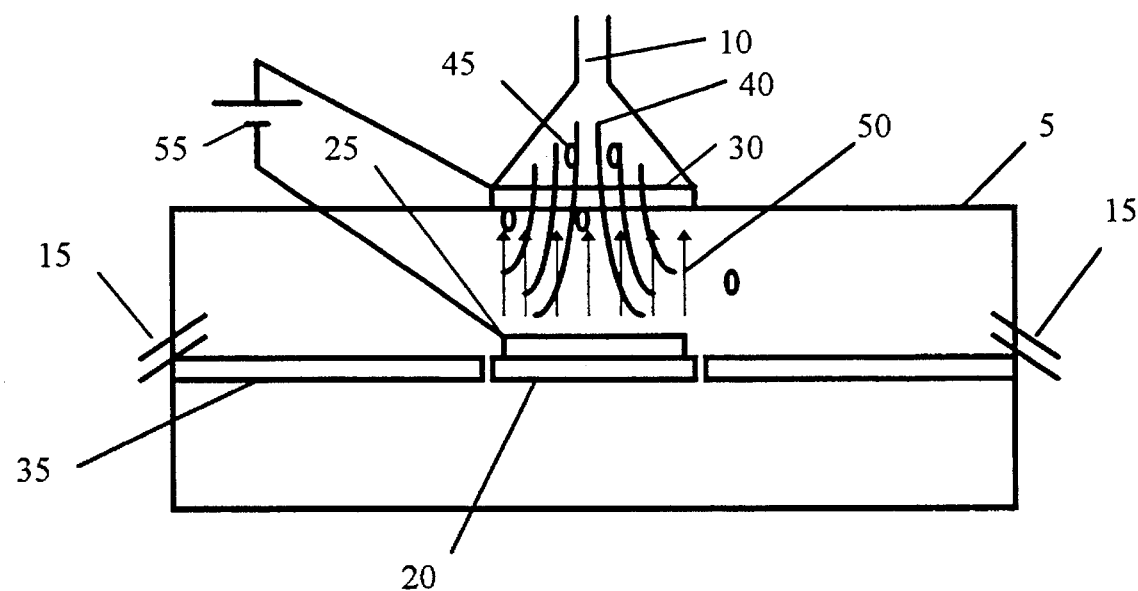
FIG. 2 is a cross-sectional view of a CVD reactor according to this invention showing a single electric field and representative charged particles.

FIG. 2 shows the CVD reactor of FIG. 1 improved by one embodiment on the invention. In a CVD process, contaminant particles are often charged to one polarity. As disclosed herein, charged contaminant particles are repelled from the wafer 25 by an electric field 50 generated between the showerhead 30 and the wafer 25. These, particles are then carded out of the chamber 5 with the processing gas exhaust or deposited on the lower surface of the showerhead 30 rather than deposited on the wafer 25.

The electric field can be generated in various ways familiar to those of ordinary skill in the art. For example, if the wafer 25 is electrically connected to the susceptor 20, a voltage source 55 can be connected between the susceptor 20 and the showerhead 30 to generate the desired electric field. Suitable values of electric field can be on the order of 50 to 500 volts per centimeter. In operation, particles of the same polarity as the wafer are repelled by the electric field. The uncharged gas flow is unaffected, and thus the desired processing proceeds as it would without the electric field. The charged contaminant particles,, however, are accelerated away from the wafer by the electric field, reducing the deposition of contaminants and thus improving the yield of functional microchips.

Figure 3:
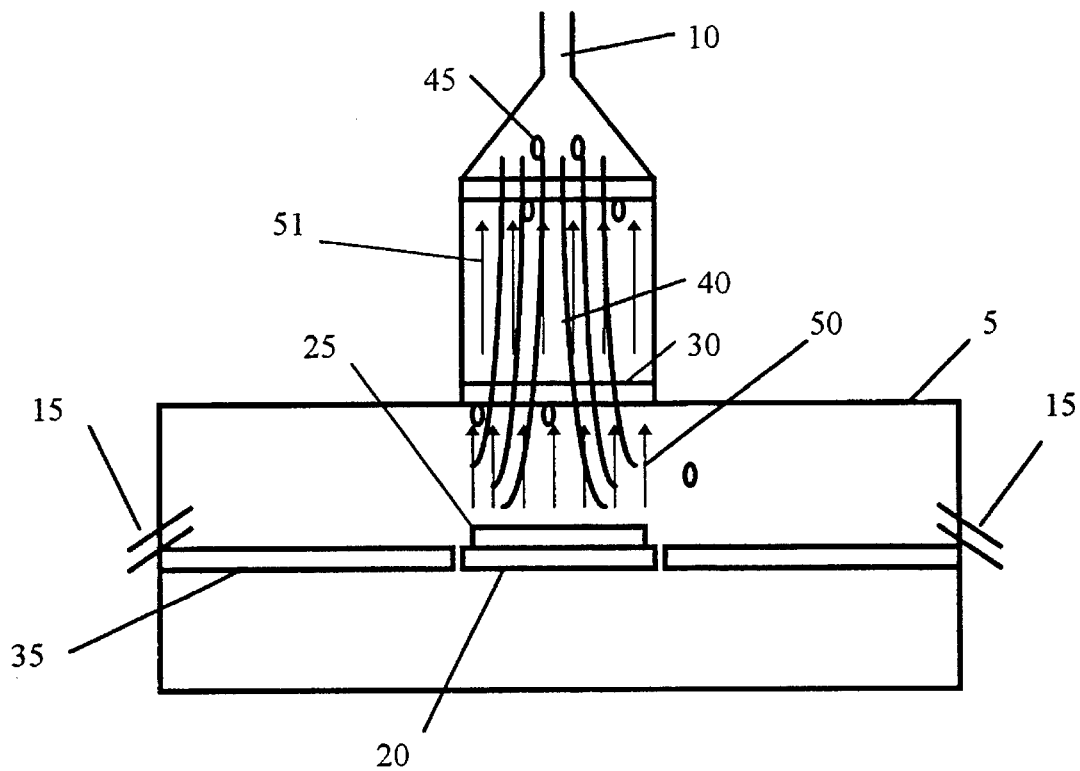
FIG. 3 is a cross-sectional view of a CVD reactor according to this invention showing two electric fields and representative charged particles.

Another embodiment of the invention is shown in FIG. 3. An second, upstream electric field 51 is introduced between the first showerhead 30 and an upstream showerhead 31. Contaminant particles of a first polarity 46 are repelled by the upstream electric field 51 and prevented from reaching the first showerhead 30. Contaminant particles with opposing polarity 45 are repelled by the first electric field 50 and deposited onto the surface of the first showerhead 30 or carried out with the processing gas exhaust, as described above.

The electric fields can be generated in various ways familiar to those of ordinary skill in the art. Suitable values of electric fields may be on the order of 50 to 500 volts per centimeter. The combination of two electric fields can decelerate particles of either polarity, reducing particle contamination of the microchip. The electric fields can be chosen so that the upstream electric field repels particles present in the input gas flow and the first electric field repels particles generated from the showerhead.

While the upstream electric field will trap particles of one polarity, any particles of opposing polarity will be accelerated toward the first showerhead. The value of the first electric field is chosen in view of the rest of the reactor design to repel particles accelerated by the upstream electric field. In the simplest example, the first electric field is greater in magnitude than the upstream electric field so that particles accelerated by the upstream electric field are still repelled from the wafer by the first electric field.

Figure 4:
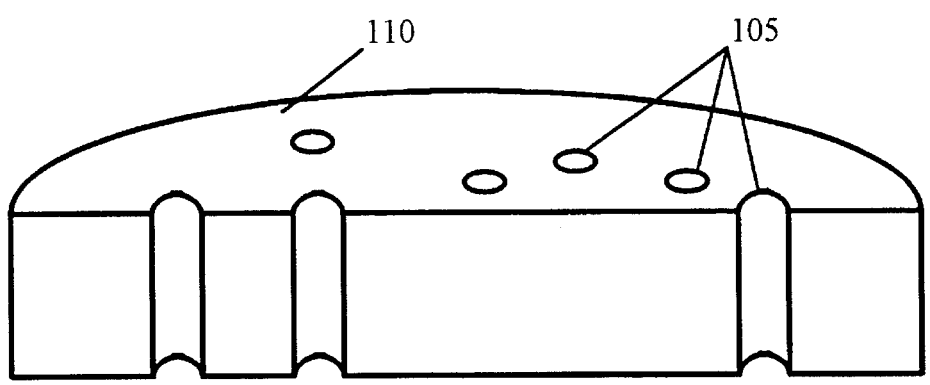
FIG. 4 shows a sectional view of a conventional showerhead.

FIG. 4 shows a prior art showerhead design. The perforations 105 comprise a number of various sized holes drilled through the plate 110. The plate is typically of a constant thickness of from 0.1 inch to 1.0 inch. The perforations in the showerhead distribute the processing gas flow evenly across the wafer. Flowing the gas through the showerhead holes creates local high speed gas jets. These high speed gas jets can result in high contaminant particle velocities toward the wafer, increasing the likelihood of inertial particle deposition on the wafer surface. In addition, the showerhead may be an additional source of contamination as particles sloughed off the showerhead are carried to the wafer by high speed gas jets.

Figure 5:
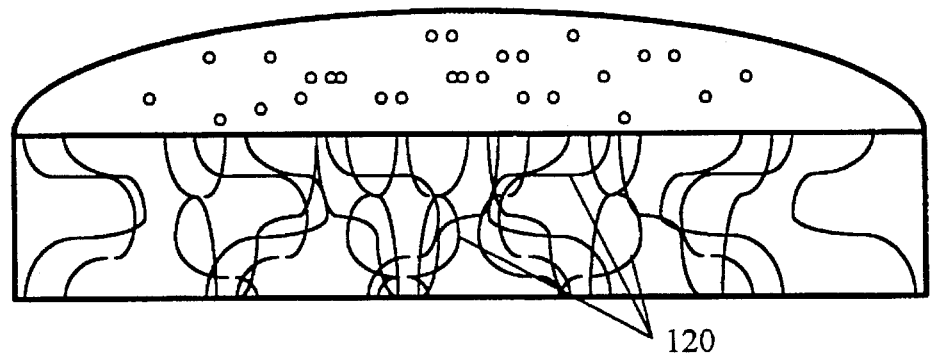
FIG. 5 shows a sectional view of a porous showerhead according to this invention.

A further embodiment of the invention is shown in FIG. 5. The straight holes in the prior art showerhead have been eliminated. In their stead, the showerhead can be made of a porous material. The many tortuous paths 120 through the pores can distribute the gas evenly without developing the high speed jets that lead to particle contamination. Suitable porous showerheads can be made from sintered metal, stacks of screens, or filters. The processing environment usually indicates that the showerhead be made of a metal such as aluminum. All of these are commercially available, and can be used according to the specific design requirements for chamber configuration, gas flow conditions, and processing performance desired. The important consideration for reducing particle contamination due to the showerhead is that the showerhead provide sufficient flow restriction to result in uniform flow distribution while the number of pores and the tortuosity of the paths reduce the gas jetting phenomenon and discourage the high speed transport of contaminant particles.

Other embodiments of this principle will also be apparent to those skilled in the art. The number, magnitude, and orientation of the electric fields can be changed to better reduce particle contamination. For example, the electric fields could be generated transversely to the gas flow, accelerating particles toward the sides of the gas flow and away from the wafer surface. Combinations of the embodiments described here will also be apparent to those skilled in the art. For example, the use of a porous showerhead to decelerate particles can be combined with electric fields to further decelerate particles and discourage their deposition on the wafer surface.

The particular sizes and equipment discussed above are cited merely to illustrate a particular embodiment of the invention. It is contemplated that the use of the invention may involve components having different sizes and shapes as long as the principle, the reduction of contaminant particle velocity toward the wafer, is followed. It is intended that the scope of the invention be defined by the claims appended hereto.

We claim:

1. An apparatus for processing a microchip wafer comprising:
   a) means for distributing a processing gas flow on the wafer, said gas flow containing charged contaminant particles, and said means comprising;
      showerhead that allows passage of the processing gas therethrough,
      susceptor means for holding the wafer,
      means for holding said showerhead in relation to said susceptor means so that the processing gas flows over the wafer and
      an input means for providing processing gas to the showerhead; and
   b) deceleration means for reducing the contaminant particle velocity component toward the wafer relative to its other velocity components, thereby inhibiting the deposition on the wafer surface of said contaminant particles, said deceleration means comprising means for providing a first electric field between said showerhead and the wafer;
   wherein said deceleration means further comprises means for generating a second electric field between said input means and said showerhead, said second electric field repelling charged contaminant particles from said showerhead.

2. The apparatus of claim 1 wherein the first electric field is selected to repel contaminant particles of one polarity and the second electric field is selected to repel contaminant particles of opposite polarity.

3. The apparatus of claim 2 wherein the magnitude of the first electric field is greater than the magnitude of the second electric field.

4. The apparatus of claim 1 wherein said deceleration means comprises a showerhead with a plurality of tortuous paths allowing the flow of processing gas therethrough.

5. The apparatus of claim 4 wherein said showerhead is made of metal.

6. The apparatus of claim 1 wherein said showerhead has a plurality of tortuous paths therethrough.

* * * * *